United States Patent
Hwang et al.

(10) Patent No.: US 10,302,728 B2
(45) Date of Patent: May 28, 2019

(54) MAGNETIC RESONANCE IMAGING APPARATUS AND METHOD OF GENERATING MAGNETIC RESONANCE IMAGE

(71) Applicant: SAMSUNG ELECTRONICS CO., LTD., Suwon-si (KR)

(72) Inventors: Jin-young Hwang, Suwon-si (KR); Joon-soo Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 479 days.

(21) Appl. No.: 15/055,834

(22) Filed: Feb. 29, 2016

(65) Prior Publication Data

US 2017/0003369 A1    Jan. 5, 2017

(30) Foreign Application Priority Data

Jun. 30, 2015  (KR) .................. 10-2015-0093230

(51) Int. Cl.
*G01V 3/00*    (2006.01)
*G01R 33/563*  (2006.01)
(Continued)

(52) U.S. Cl.
CPC .... *G01R 33/56366* (2013.01); *G01R 33/4822* (2013.01); *G01R 33/5611* (2013.01); *G01R 33/5614* (2013.01)

(58) Field of Classification Search
CPC .......... G01R 33/5635; G01R 33/56366; G01R 33/4833; G01R 33/543; G01R 33/4835;
(Continued)

(56) References Cited

U.S. PATENT DOCUMENTS

2006/0220645 A1    10/2006  Zhang
2009/0005670 A1*   1/2009   Ichinose .......... G01R 33/56308
                                                              600/410
(Continued)

FOREIGN PATENT DOCUMENTS

JP     2006-280930 A    10/2006
JP     2007-313303 A    12/2007
(Continued)

OTHER PUBLICATIONS

Communication dated May 16, 2016, issued by the Korean Intellectual Property Office in counterpart Korean Application No. 10-2015-0093230.
(Continued)

*Primary Examiner* — Rodney E Fuller
(74) *Attorney, Agent, or Firm* — Sughrue Mion, PLLC

(57) ABSTRACT

A magnetic resonance imaging apparatus includes a signal transceiver, and a sequence controller configured to control the signal transceiver to apply an RF pulse and a gradient magnetic field to a first portion of an object, wait for blood to flow from the first portion of the object to which the RF pulse and the gradient magnetic field are applied, to a second portion of the object, and apply the RF pulse and the gradient magnetic field to the second portion of the object to which the blood flows, using a 3D balanced steady-state free precession (bSSFP), and subsample first magnetic resonance data from the second portion of the object to which the RF pulse and the gradient magnetic field are applied. The apparatus further includes an image processor configured to generate label image data based on the first magnetic resonance data.

19 Claims, 9 Drawing Sheets

(51) Int. Cl.
    *G01R 33/561* (2006.01)
    *G01R 33/48* (2006.01)
(58) Field of Classification Search
    CPC .... G01R 33/5616; G01R 33/20; G01R 33/48;
                    G01R 33/4818; G01R 33/4824
    USPC ........................................................ 324/309
    See application file for complete search history.

(56) References Cited

U.S. PATENT DOCUMENTS

| | | | |
|---|---|---|---|
| 2012/0302872 A1 | 11/2012 | Miyazaki et al. | |
| 2013/0085379 A1 | 4/2013 | Feinberg | |
| 2013/0141094 A1 | 6/2013 | Miyazaki | |
| 2014/0152304 A1* | 6/2014 | Fielden | G01R 33/565 324/309 |
| 2014/0203805 A1 | 7/2014 | Kim et al. | |
| 2014/0210465 A1 | 7/2014 | Kim et al. | |

FOREIGN PATENT DOCUMENTS

| | | |
|---|---|---|
| JP | 2008-253368 A | 10/2008 |
| JP | 200928525 A | 2/2009 |
| JP | 2009-50605 A | 3/2009 |
| KR | 1020120035022 A | 4/2012 |
| KR | 10-2014-0094174 A | 7/2014 |
| KR | 10-2014-0096917 A | 8/2014 |

OTHER PUBLICATIONS

Communication dated Sep. 1, 2016, issued by the Korean Intellectual Property Office in corresponding Korean Application No. 10-2015-0093230.

Communication dated Oct. 18, 2016, issued by the Korean Intellectual Property Office in corresponding Korean Application No. 10-2015-0093230.

* cited by examiner

MAGNETIC RESONANCE IMAGING APPARATUS AND METHOD OF GENERATING MAGNETIC RESONANCE IMAGE

CROSS-REFERENCE TO RELATED APPLICATION

This application claims priority from Korean Patent Application No. 10-2015-0093230, filed on Jun. 30, 2015, in the Korean Intellectual Property Office, the disclosure of which is incorporated herein by reference in its entirety.

BACKGROUND

1. Field

Apparatuses and methods consistent with exemplary embodiments relate to a magnetic resonance imaging apparatus and a method of generating a magnetic resonance image.

2. Description of the Related Art

Magnetic resonance imaging apparatuses, which capture an image of a target object by using a magnetic field, are widely used for an accurate diagnosis of disorders, because magnetic resonance imaging apparatuses display not only bones but also disks, joints, and nerve ligaments in three-dimensional images from angles.

Magnetic resonance imaging apparatuses acquire a magnetic resonance signal, and display an output image after reconstructing the acquired magnetic resonance signal into an image. Magnetic resonance imaging apparatuses use various pulse sequences depending on a type of a desired magnetic resonance image.

A well-designed pulse sequence, which is used by magnetic resonance imaging apparatuses, improves the quality of the magnetic resonance image and reduces time for acquiring the magnetic resonance image. Therefore, a choice of which pulse sequence to use may be a factor, when it comes to acquiring the magnetic resonance image.

SUMMARY

Exemplary embodiments address at least the above problems and/or disadvantages and other disadvantages not described above. Also, the exemplary embodiments are not required to overcome the disadvantages described above, and may not overcome any of the problems described above.

One or more exemplary embodiments provide a magnetic resonance imaging apparatus that may acquire an arterial spin labeling (ASL) signal and a high-definition ASL image in a short period of time through a 3D balanced steady-state free precession (bSSFP) sequence.

According to an aspect of an exemplary embodiment, there is provided a magnetic resonance imaging apparatus configured to generate an arterial spin labeling (ASL) image, using a 3D balanced steady-state free precession (bSSFP) sequence, the apparatus including a signal transceiver, and a sequence controller configured to control the signal transceiver to apply an RF pulse and a gradient magnetic field to a first portion of an object, wait for blood to flow from the first portion of the object to which the RF pulse and the gradient magnetic field are applied, to a second portion of the object, apply the RF pulse and the gradient magnetic field to the second portion of the object to which the blood flows, using the 3D bSSFP, and subsample first magnetic resonance data from the second portion of the object to which the RF pulse and the gradient magnetic field are applied. The apparatus further includes an image processor configured to generate label image data based on the first magnetic resonance data.

The sequence controller may be further configured to control the signal transceiver to subsample the first magnetic resonance data during a transient period and a steady-state period of the RF pulse.

The image processor may be further configured to generate the label image data using parallel imaging.

The sequence controller may be further configured to control the signal transceiver to acquire the first magnetic resonance data from an entire area of the object that is imaged during a data acquisition period.

The image processor may be further configured to generate the ASL image based on the label image data.

The sequence controller may be further configured to control the signal transceiver to apply the RF pulse and the gradient magnetic field to the first portion of the object during an RF labeling period, apply the RF pulse and the gradient magnetic field to the second portion of the object during a data acquisition period, and receive a magnetic resonance signal from the second portion of the object to which the RF pulse and the gradient magnetic field are applied, and the image processor may be further configured to generate the label image data based on the magnetic resonance signal.

The sequence controller may be further configured to control the signal transceiver to apply the RF pulse and the gradient magnetic field to the second portion of the object during a data acquisition period without applying the RF pulse and the gradient magnetic field to the first portion of the object during an RF labeling period, and receive a magnetic resonance signal from the second portion of the object to which the RF pulse and the gradient magnetic field are applied, and the image processor may be further configured to generate control image data based on the magnetic resonance signal.

The sequence controller may be further configured to control the signal transceiver to apply the RF pulse and the gradient magnetic field to the second portion of the object, using the 3D bSSFP without applying the RF pulse and the gradient magnetic field to the first portion of the object, and subsample second magnetic resonance data from the second portion of the subject to which the RF pulse and the gradient magnetic field are applied, and the image processor may be further configured to generate control image data based on the second magnetic resonance data.

The image processor may be further configured to generate the ASL image based on the control image data and the label image data.

A medical imaging system may include the magnetic resonance imaging apparatus, and an image processing apparatus configured to process the ASL image.

According to an aspect of an exemplary embodiment, there is provided a method of generating an arterial spin labeling (ASL) image, using a 3D balanced steady-state free precession (bSSFP) sequence, the method including applying an RF pulse and a gradient magnetic field to a first portion of an object, waiting for blood to flow from the first portion of the object to which the RF pulse and the gradient magnetic field are applied, to a second portion of the object, applying the RF pulse and the gradient magnetic field to the second portion of the object to which the blood flows, using the 3D bSSFP, subsampling first magnetic resonance data from the second portion of the subject to which the RF pulse and the gradient magnetic field are applied, and generating label image data based on the first magnetic resonance data.

The subsampling may include subsampling the first magnetic resonance data during a transient period and a steady-state period of the RF pulse.

The generating may include generating the label image data using parallel imaging.

The subsampling may include acquiring the first magnetic resonance data from an entire area of the object that is imaged during a data acquisition period.

The method may further include applying the RF pulse and the gradient magnetic field to the second portion of the object, using the 3D bSSFP without applying the RF pulse and the gradient magnetic field to the first portion of the object, subsampling second magnetic resonance data from the second portion of the subject to which the RF pulse and the gradient magnetic field are applied, and generating control image data based on the second magnetic resonance data.

The subsampling the second magnetic resonance data may include subsampling the second magnetic resonance data during a transient period and a steady-state period of the RF pulse.

The generating the control image data may include generating the control image data using parallel imaging.

The subsampling the second magnetic resonance data may include acquiring the second magnetic resonance data from an entire area of the object that is imaged during a data acquisition period.

The method may further include generating the ASL image based on the control image data and the label image data.

A non-transitory computer-readable storage medium may store a program including instructions to cause a computer to perform the method.

BRIEF DESCRIPTION OF THE DRAWINGS

The above and/or other aspects will be more apparent by describing exemplary embodiments, with reference to the accompanying drawings, in which.

DETAILED DESCRIPTION

Figure 1:
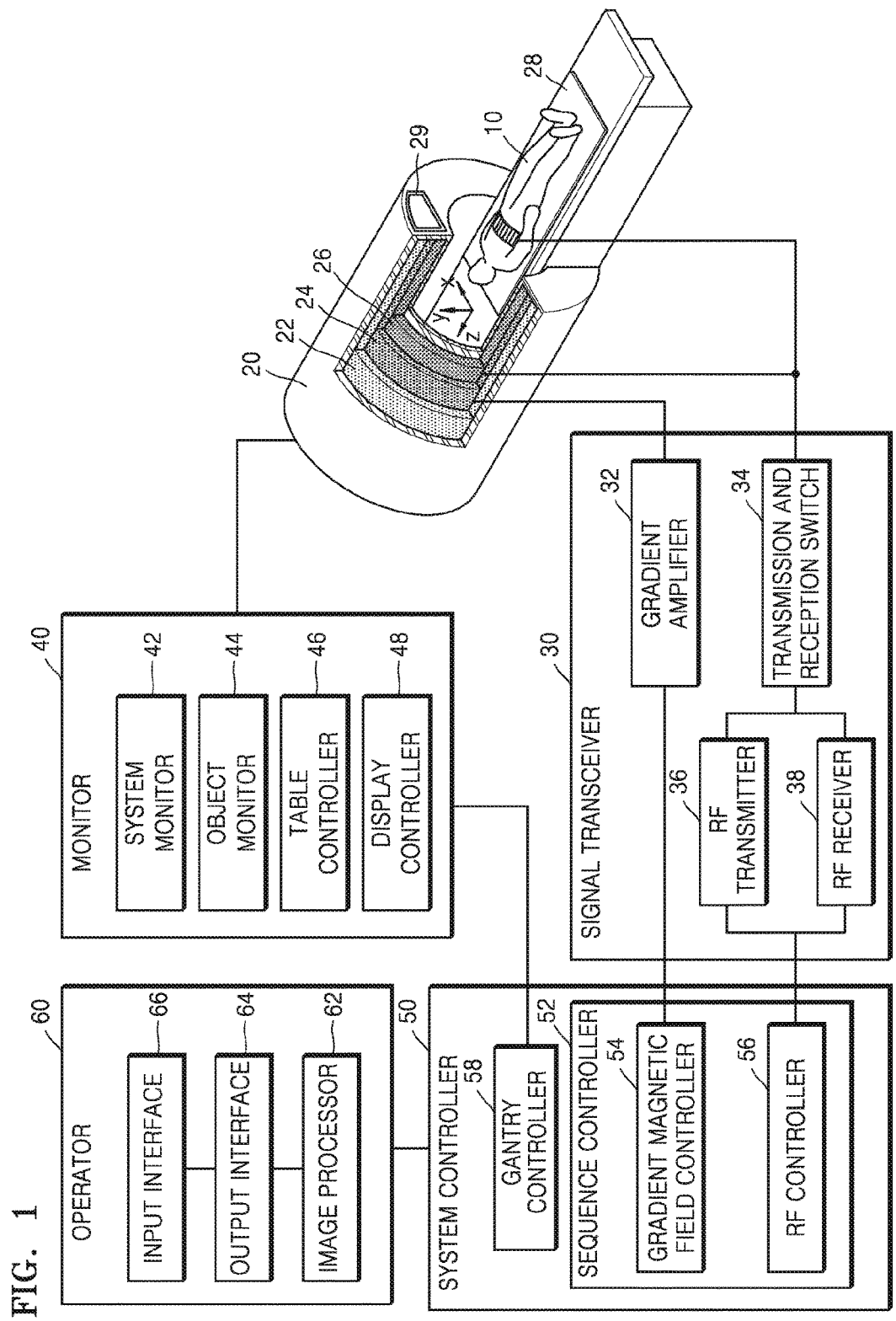
FIG. 1 is a block diagram of a magnetic resonance imaging (MRI) system, according to an exemplary embodiment.

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions may not be described in detail because they would obscure the description with unnecessary detail.

It will be understood that the terms "comprises" and/or "comprising" used herein specify the presence of stated features or components, but do not preclude the presence or addition of one or more other features or components. In addition, the terms such as "unit," "-er (-or)," and "module" described in the specification refer to an element for performing at least one function or operation, and may be implemented in hardware, software, or the combination of hardware and software.

In the present specification, an "image" may refer to multi-dimensional data composed of discrete image elements (e.g., pixels in a two-dimensional (2D) image and voxels in a three-dimensional (3D) image). For example, the image may be a medical image of an object captured by an X-ray apparatus, a computed tomography (CT) apparatus, a magnetic resonance imaging (MRI) apparatus, an ultrasound diagnosis apparatus, or another medical imaging apparatus.

Furthermore, in the present specification, an "object" may be a human, an animal, or a part of a human or animal. For example, the object may be an organ (e.g., the liver, the heart, the womb, the brain, a breast, or the abdomen), a blood vessel, or a combination thereof. Furthermore, the "object" may be a phantom. The phantom refers to a material having a density, an effective atomic number, and a volume that are approximately the same as those of an organism. For example, the phantom may be a spherical phantom having properties similar to the human body.

Furthermore, in the present specification, a "user" may be, but is not limited to, a medical expert, such as a medical doctor, a nurse, a medical laboratory technologist, or a technician who repairs a medical apparatus.

Furthermore, in the present specification, an "MR image" refers to an image of an object obtained by using the nuclear magnetic resonance principle.

Furthermore, in the present specification, a "pulse sequence" refers to continuity of signals repeatedly applied by an MRI apparatus. The pulse sequence may include a time parameter of a radio frequency (RF) pulse, for example, repetition time (TR) or echo time (TE).

Furthermore, in the present specification, a "pulse sequence schematic diagram" shows an order of events that occur in an MRI apparatus. For example, the pulse sequence schematic diagram may be a diagram showing an RF pulse, a gradient magnetic field, an MR signal, or the like according to time.

An MRI system is an apparatus for acquiring a periodal image of a part of an object by expressing, in a contrast comparison, a strength of a MR signal with respect to an RF signal generated in a magnetic field having a strength. For example, if an RF signal that only resonates an atomic nucleus (for example, a hydrogen atomic nucleus) is emitted for an instant toward the object placed in a strong magnetic field and then such emission stops, an MR signal is emitted from the atomic nucleus, and thus the MRI system may receive the MR signal and acquire an MR image. The MR signal denotes an RF signal emitted from the object. An intensity of the MR signal may be determined according to a density of a predetermined atom (for example, hydrogen) of the object, a relaxation time T1, a relaxation time T2, and a flow of blood or the like.

MRI systems include characteristics different from those of other imaging apparatuses. Unlike imaging apparatuses such as CT apparatuses that acquire images according to a direction of detection hardware, MRI systems may acquire 2D images or 3D volume images that are oriented toward an optional point. MRI systems do not expose objects or examiners to radiation, unlike CT apparatuses, X-ray apparatuses, position emission tomography (PET) apparatuses, and single photon emission CT (SPECT) apparatuses, may acquire images having high soft tissue contrast, and may acquire neurological images, intravascular images, musculoskeletal images, and oncologic images that are for precisely capturing abnormal tissues.

MRI systems may acquire several 2D slice images in the direction of the slices which constitute a 3D volume to acquire 3D volume information of the object in a short time. In this case, it is common to capture 2D slice images sequentially, corresponding to the number of slices. However, it may take a large amount of time to capture the images when the images are captured sequentially.

FIG. 1 is a block diagram of an MRI system, according to an exemplary embodiment. Referring to FIG. 1, the MRI system includes a gantry 20, a signal transceiver 30, a monitor 40, a system controller 50, and an operator 60.

The gantry 20 prevents external emission of electromagnetic waves generated by a main magnet 22, a gradient coil 24, and an RF coil 26. A magnetostatic field and a gradient magnetic field are formed in a bore in the gantry 20, and an RF signal is emitted toward an object 10.

The main magnet 22, the gradient coil 24, and the RF coil 26 may be arranged in a predetermined direction of the gantry 20. The predetermined direction may be a coaxial cylinder direction. The object 10 is disposed on a table 28 that is capable of being inserted into a cylinder along a horizontal axis of the cylinder.

The main magnet 22 generates a magnetostatic field or a static magnetic field for aligning magnetic dipole moments of atomic nuclei of the object 10 in a constant direction. A precise and accurate MR image of the object 10 may be obtained due to a magnetic field generated by the main magnet 22 being strong and uniform.

The gradient coil 24 includes X, Y, and Z coils for generating gradient magnetic fields in X-, Y-, and Z-axis directions crossing each other at right angles. The gradient coil 24 may provide location information of each region of the object 10 by differently inducing resonance frequencies according to the regions of the object 10.

The RF coil 26 may emit an RF signal toward a patient and receive an MR signal emitted from the patient. In detail, the RF coil 26 may apply, toward atomic nuclei included in the patient and having precessional motion, an RF signal having the same frequency as that of the precessional motion, stop applying the RF signal, and then receive an MR signal emitted from the atomic nuclei included in the patient.

For example, to transit an atomic nucleus from a low energy state to a high energy state, the RF coil 26 may generate and apply an electromagnetic wave signal that is an RF signal corresponding to a type of the atomic nucleus, to the object 10. When the electromagnetic wave signal generated by the RF coil 26 is applied to the atomic nucleus, the atomic nucleus may transit from the low energy state to the high energy state. Then, when electromagnetic waves generated by the RF coil 26 disappear, the atomic nucleus to which the electromagnetic waves were applied transits from the high energy state to the low energy state, thereby emitting electromagnetic waves having a Lamor frequency. In other words, when the applying of the electromagnetic wave signal to the atomic nucleus is stopped, an energy level of the atomic nucleus is changed from a high energy level to a low energy level, and thus the atomic nucleus may emit electromagnetic waves having a Lamor frequency. The RF coil 26 may receive electromagnetic wave signals from atomic nuclei included in the object 10.

The RF coil 26 may be realized as one RF applying and receiving coil having both a function of generating electromagnetic waves each having an RF that corresponds to a type of an atomic nucleus and a function of receiving electromagnetic waves emitted from an atomic nucleus. Alternatively, the RF coil 26 may be realized as a transmission RF coil having a function of generating electromagnetic waves each having an RF that corresponds to a type of an atomic nucleus, and a reception RF coil having a function of receiving electromagnetic waves emitted from an atomic nucleus.

The RF coil 26 may be fixed to the gantry 20 or may be detachable. When the RF coil 26 is detachable, the RF coil 26 may be an RF coil for a part of the object, such as a head RF coil, a chest RF coil, a leg RF coil, a neck RF coil, a shoulder RF coil, a wrist RF coil, or an ankle RF coil.

The RF coil 26 may communicate with an external apparatus via wires and/or wirelessly, and may also perform dual tune communication according to a communication frequency band.

The RF coil 26 may communicate with an external apparatus via wires and/or wirelessly, and may also perform dual tune communication according to a communication frequency band.

The RF coil 26 may be a transmission exclusive coil, a reception exclusive coil, or a transmission and reception coil according to methods of applying and receiving an RF signal.

The RF coil 26 may be an RF coil having various numbers of channels, such as 16 channels, 32 channels, 72 channels, and 144 channels.

The gantry 20 further includes a display 29 disposed outside the gantry 20 and a display disposed inside the gantry 20. The gantry 20 may provide predetermined information to the user or the object 10 through the display 29 and the display respectively disposed outside and inside the gantry 20.

The signal transceiver 30 may control the gradient magnetic field formed inside the gantry 20, i.e., in the bore, according to a predetermined pulse sequence, and control transmission and reception of an RF signal and an MR signal.

The signal transceiver 30 includes a gradient amplifier 32, a transmission and reception switch 34, an RF transmitter 36, and an RF receiver 38.

The signal transceiver 30 may apply the RF pulse and gradient magnetic field to the object by identifying an RF labeling period, a post labeling delay (PLD) period and a data acquisition period through control of the controller 52.

The gradient amplifier 32 drives the gradient coil 24 included in the gantry 20, and may supply a pulse signal for generating a gradient magnetic field to the gradient coil 24 under the control of a gradient magnetic field controller 54. By controlling the pulse signal supplied from the gradient amplifier 32 to the gradient coil 24, gradient magnetic fields in X-, Y-, and Z-axis directions may be synthesized.

The RF transmitter 36 and the RF receiver 38 may drive the RF coil 26. The RF transmitter 36 may supply an RF pulse in a Lamor frequency to the RF coil 26, and the RF receiver 38 may receive an MR signal received by the RF coil 26.

The transmission and reception switch 34 may adjust applying and receiving directions of the RF signal and the MR signal. For example, the transmission and reception switch 34 may emit the RF signal toward the object 10 through the RF coil 26 during a transmission mode, and receive the MR signal from the object 10 through the RF coil 26 during a reception mode. The transmission and reception switch 34 may be controlled by a control signal output by an RF controller 56.

The monitor 40 may monitor or control the gantry 20 or devices mounted on the gantry 20. The monitor 40 includes a system monitor 42, an object monitor 44, a table controller 46, and a display controller 48.

The system monitor 42 may monitor and control a state of the magnetostatic field, a state of the gradient magnetic field, a state of the RF signal, a state of the RF coil 26, a state of the table 28, a state of a device measuring body information of the object 10, a power supply state, a state of a thermal exchanger, and a state of a compressor.

The object monitor 44 monitors a state of the object 10. In detail, the object monitor 44 may include a camera for observing a movement or position of the object 10, a respiration measurer for measuring the respiration of the object 10, an electrocardiogram (ECG) measurer for measuring the electrical activity of the object 10, or a temperature measurer for measuring a temperature of the object 10.

The table controller 46 controls a movement of the table 28 where the object 10 is positioned. The table controller 46 may control the movement of the table 28 according to a sequence control of a sequence controller 52. For example, during moving imaging of the object 10, the table controller 46 may continuously or discontinuously move the table 28 according to the sequence control of the sequence controller 52, and thus the object 10 may be photographed in a field of view (FOV) larger than that of the gantry 20.

The display controller 48 controls the display 29 disposed outside the gantry 20 and the display disposed inside the gantry 20. In detail, the display controller 48 may control the display 29 and the display to be on or off, and may control a screen image to be output on the display 29 and the display. Also, when a speaker is located inside or outside the gantry 20, the display controller 48 may control the speaker to be on or off, or may control sound to be output via the speaker.

The system controller 50 includes the sequence controller 52 for controlling a sequence of signals formed in the gantry 20, and a gantry controller 58 for controlling the gantry 20 and the devices mounted on the gantry 20.

The sequence controller 52 includes the gradient magnetic field controller 54 for controlling the gradient amplifier 32, and the RF controller 56 for controlling the RF transmitter 36, the RF receiver 38, and the transmission and reception switch 34. The sequence controller 52 may control the gradient amplifier 32, the RF transmitter 36, the RF receiver 38, and the transmission and reception switch 34 according to a pulse sequence received from the operator 60.

Here, the pulse sequence includes all information to control the gradient amplifier 32, the RF transmitter 36, the RF receiver 38, and the transmission and reception switch 34. For example, the pulse sequence may include information about a strength, an application time, and application timing of a pulse signal applied to the gradient coil 24.

The sequence controller 52 may control the signal transceiver 30 in such a manner that the signal transceiver 30 applies the balanced steady-state free precession (bSSFP) sequence to the object.

The sequence controller 52 according to an exemplary embodiment may acquire an arterial spin labeling (ASL) image in a short time through a 3D bSSFP sequence.

The operator 60 may request the system controller 50 to apply pulse sequence information while controlling an overall operation of the MRI system.

The operator 60 includes an image processor 62 for receiving and processing the MR signal received by the RF receiver 38, an output interface 64, and an input interface 66.

The image processor 62 may process the MR signal received from the RF receiver 38 to generate MR image data of the object 10.

The image processor 62 receives the MR signal received by the RF receiver 38 and performs any one of various signal processes, such as amplification, frequency transformation, phase detection, low frequency amplification, and filtering, on the received MR signal.

The image processor 62 may arrange data in a k space (for example, also referred to as a Fourier space or a frequency space) of a memory, and rearrange the digital data into image data via 2D or 3D Fourier transformation.

The image processor 62 may perform a composition process or difference calculation process on the image data. The composition process may include an addition process on a pixel or a maximum intensity projection (MIP) process. The image processor 62 may store not only the rearranged image data but also image data on which a composition process or a difference calculation process is performed, in a memory or an external server.

The image processor 62 may perform any of the signal processes on the MR signal in parallel. For example, the image processor 62 may perform a signal process on a plurality of MR signals received by a multi-channel RF coil in parallel to rearrange the plurality of MR signals into image data.

The image processor 62 may generate the control image data and the label image data, and generate the ASL image by using at least one of the control image data and label image data.

The output interface 64 may output image data generated or rearranged by the image processor 62 to the user. The output interface 64 may also output information for the user to manipulate the MRI system, such as a user interface (UI), user information, or object information. The output interface 64 may be a speaker, a printer, a cathode-ray tube (CRT) display, a liquid crystal display (LCD), a plasma display panel (PDP), an organic light-emitting device (OLED) display, a field emission display (FED), a light-emitting diode (LED) display, a vacuum fluorescent display (VFD), a digital light processing (DLP) display, a flat panel display (FPD), a 3D display, a transparent display, or any one of other various output devices that are well known to one of ordinary skill in the art.

The user may input object information, parameter information, a scan condition, a pulse sequence, or information about image composition or difference calculation by using the input interface 66. The input interface 66 may be a keyboard, a mouse, a track ball, a voice recognizer, a gesture recognizer, a touch screen, or any one of other various input devices that are well known to one of ordinary skill in the art.

The signal transceiver 30, the monitor 40, the system controller 50, and the operator 60 are separate components in FIG. 1, but it will be obvious to one of ordinary skill in the art that respective functions of the signal transceiver 30, the monitor 40, the system controller 50, and the operator 60 may be performed by another component. For example, the image processor 62 converts the MR signal received from the RF receiver 38 into a digital signal in FIG. 1, but alternatively, the conversion of the MR signal into the digital signal may be performed by the RF receiver 38 or the RF coil 26.

The gantry 20, the RF coil 26, the signal transceiver 30, the monitor 40, the system controller 50, and the operator 60 may be connected to each other by wire or wirelessly, and when they are connected wirelessly, the MRI system may further include an apparatus for synchronizing clock signals therebetween. Communication between the gantry 20, the RF coil 26, the signal transceiver 30, the monitor 40, the system controller 50, and the operator 60 may be performed by using a high-speed digital interface, such as low voltage differential signaling (LVDS), asynchronous serial communication, such as a universal asynchronous receiver transmitter (UART), a low-delay network protocol, such as error synchronous serial communication or a controller area network (CAN), or optical communication.

Figure 2:
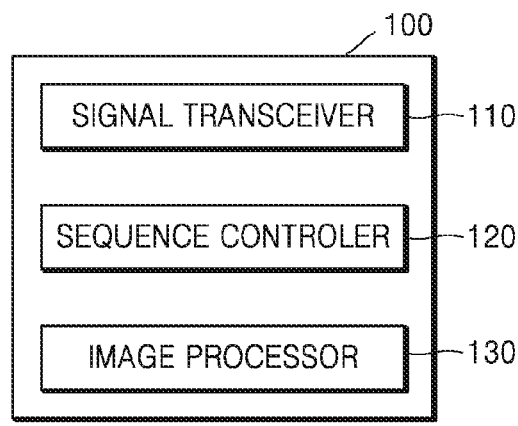
FIG. 2 is a block diagram illustrating a magnetic resonance imaging apparatus, according to an exemplary embodiment.
Figure 3:
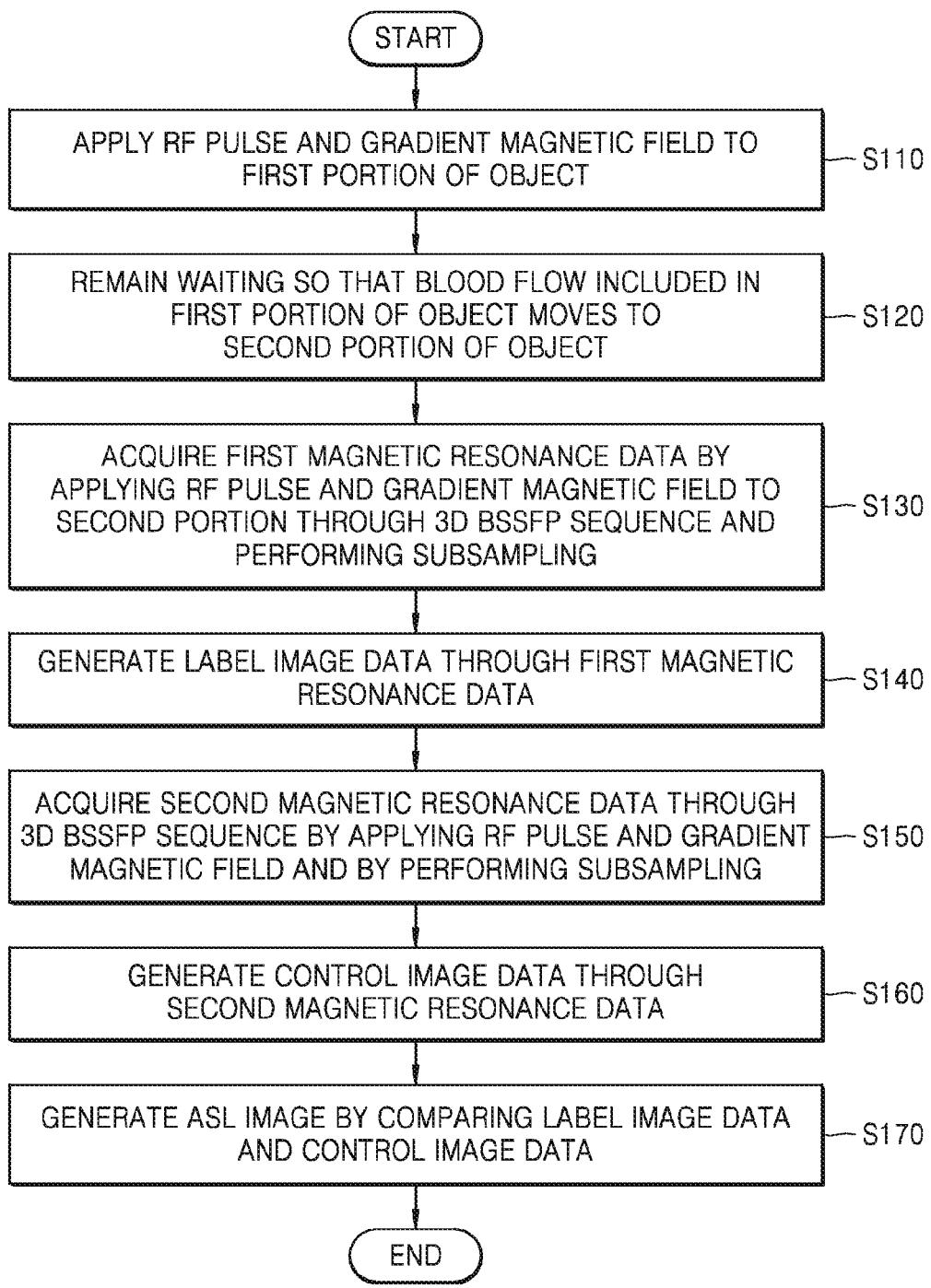
FIG. 3 is a flowchart illustrating a method of generating a magnetic resonance image, according to an exemplary embodiment.

Major structural components and operations of a magnetic resonance imaging apparatus according to the disclosure are described in detail in explanations on FIGS. 2 and 3.

FIG. 2 is a block diagram illustrating the magnetic resonance imaging apparatus 100, according to an exemplary embodiment.

Referring to FIG. 2, the magnetic resonance imaging apparatus 100 includes a signal transceiver 110, a sequence controller 120 and an image processor 130.

The magnetic resonance imaging apparatus 100 may generate the ASL image through the operations of the signal transceiver 110, the sequence controller 120 and the image processor 130. For example, the magnetic resonance imaging apparatus 100 may generate the ASL image through the balanced steady-state free precession sequence.

The signal transceiver 110 may apply the RF pulse and gradient magnetic field to the object and receive the magnetic resonance signal from the object.

The signal transceiver 110 may apply the RF pulse and the gradient magnetic field, and transmit and receive the RF signal and the magnetic resonance signal, depending on a pulse sequence. For example, the signal transceiver 110 may apply the gradient magnetic field to the object according to the 3D bSSFP sequence under the control of the sequence controller 120.

The signal transceiver 110 may apply the RF pulse and the gradient magnetic field to the object by identifying an RF labeling period, a PLD period and a data acquisition period. For example, the signal transceiver 110 may generate the RF signal in such a manner that, the blood flow in the neck of the object may be flipped 180 degrees in the RF labeling period. The signal transceiver 110 may remain waiting without creating the RF signal at the PLD period. The signal transceiver 110 may receive the magnetic resonance signal from the blood flow included in the cerebral part of the object at the data acquisition period.

The sequence controller 120 may control the signal transceiver 110 in such a manner that the signal transceiver 110 creates the RF pulse and the gradient magnetic field according to a predetermined pulse sequence. As explained in detail above, the sequence controller 120 may control the signal transceiver 110 in such a manner that the signal transceiver 110 applies the RF pulse and the gradient magnetic field to the object by identifying the RF labeling period, the PLD period and the data acquisition period.

According to an exemplary embodiment, the sequence controller 120 of the magnetic resonance imaging apparatus 100 may control the signal transceiver 110 in such a manner that the signal transceiver 110 receives the magnetic resonance data by perform the subsampling of the object.

For example, the sequence controller 120 may control the the signal transceiver 110 in such a manner that the signal transceiver 110 generates the control image data and/or the label image data by receiving 3D magnetic resonance data which corresponds to a portion of a k-space included in a FOV.

According to an exemplary embodiment, the sequence controller 120 of the magnetic resonance imaging apparatus 100 may control the signal transceiver 110 in such a manner that the signal transceiver 110 receives the magnetic resonance data by perform the subsampling of the object at the transient period and the steady-state period.

According to an exemplary embodiment, the image processor 130 of the magnetic resonance imaging apparatus 100 may generate the control image data and/or the label image data through the parallel imaging technique.

The parallel imaging technique may be a technique in which it is possible to acquire the magnetic resonance data for a plurality of 2D slices at the same time and to separate the magnetic resonance signal for each of the slices. The parallel imaging technique may include different types of Sensitivity Encoding Imaging and generalized auto calibrating partially parallel acquisition (GRAPPA). The parallel imaging technique may be also called a "parallel MRI (pMRI)."

According to an exemplary embodiment, the signal transceiver 110 of the magnetic resonance imaging apparatus 100 may receive the magnetic resonance data from the entire area to be imaged among the object at the data acquisition period. For example, the signal transceiver 110 may receive the magnetic resonance data from the entire FOV to be imaged at the data acquisition period.

FIG. 3 is a flowchart illustrating a method of generating a magnetic resonance image, according to an exemplary embodiment.

Referring FIG. 3, the magnetic resonance imaging apparatus 100 may receive an ASL image through an SSFP sequence at stages S110 through S170.

At stage S110, the magnetic resonance imaging apparatus 100 applies an RF pulse and a gradient magnetic field to a first portion of an object. For example, the magnetic resonance imaging apparatus 100 may perform the labelling of the blood flow which runs through the neck of the object by applying the RF pulse and the gradient magnetic field to the neck of the subject. In detail, the magnetic resonance imaging apparatus 100 may apply the RF signal in such a manner that the blood flow which runs through the neck may be flipped 180 degrees.

At stage S120, the magnetic resonance imaging apparatus 100 remains waiting so that the blood flow included in the first portion of the object moves to a second portion of the object. For example, the magnetic resonance imaging apparatus 100 may remain waiting so that the blood flow running through the neck of the subject which has gone through the labelling moves to the cerebral part of the subject.

According to an exemplary embodiment, the magnetic resonance imaging apparatus 100 may acquire a high-quality ASL image by adjusting the waiting time. In other parts of this specification, the waiting time may be called a "duration of time at the PLD period."

At stage S130, the magnetic resonance imaging apparatus 100 acquires first magnetic resonance data by applying the RF pulse and the gradient magnetic field to the second portion through a 3D bSSFP sequence and performing subsampling. The 3D bSSFP sequence may mean the pulse sequence described in FIG. 6.

Figure 6:
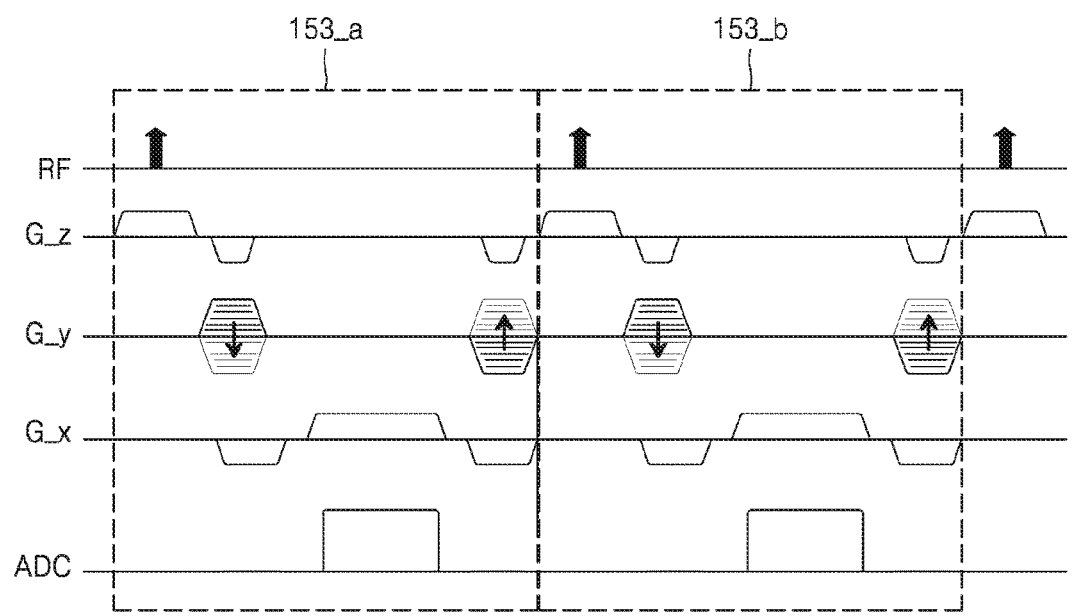
FIG. 6 is a view illustrating an order in which a magnetic resonance imaging apparatus applies an RF pulse and a gradient magnetic field to an object, in a case that the magnetic resonance imaging apparatus acquires data by using a balanced steady-state free precession (bSSFP) sequence, according to an exemplary embodiment.

For example, the magnetic resonance imaging apparatus 100 may acquire the first magnetic resonance data from the blood flow which runs through the cerebral part of the subject by applying the RF pulse and the gradient magnetic fields (i.e., G_x, G_y, G_z in FIG. 6).

According to an exemplary embodiment, the magnetic resonance imaging apparatus 100 may acquire the magnetic resonance data through the 3D bSSFP sequence and acquire the first magnetic resonance data by performing the subsampling.

According to an exemplary embodiment, the magnetic resonance imaging apparatus 100 may receive the first magnetic resonance data from the entire FOV to be imaged through the 3D bSSFP sequence.

At stage S140, the magnetic resonance imaging apparatus 100 generates label image data through the first magnetic resonance data.

For example, the magnetic resonance imaging apparatus 100 may generate the label image data from the first magnetic resonance data generated during stages S110 through S140. The image processor 130 of the magnetic resonance imaging apparatus 100 may generate the label image data by using the parallel imaging technique.

At stage S150, the magnetic resonance imaging apparatus 100 acquires second magnetic resonance data through the 3D bSSFP sequence by applying the RF pulse and the gradient magnetic field and by performing the subsampling.

According to an exemplary embodiment, the magnetic resonance imaging apparatus 100 may receive the second magnetic resonance data from the entire FOV to be imaged through the 3D bSSFP sequence.

For example, the magnetic resonance imaging apparatus 100 may acquire the magnetic resonance data from the blood flow that runs through the cerebral part of the subject without the labeling process at the stage S110. The 3D bSSFP sequence may mean the pulse sequence described in FIG. 6.

At stage S160, the magnetic resonance imaging apparatus 100 generates control image data through the second magnetic resonance data. The image processor 130 of the magnetic resonance imaging apparatus 100 may generate the control image data through the parallel imaging technique.

At stage S170, the magnetic resonance imaging apparatus 100 generates the ASL image by comparing the label image data and the control image data.

For example, the magnetic resonance imaging apparatus 100 may generate the ASL image through the label image data which are generated from the labeled blood flow and the control image data which are generated from the unlabeled blood flow.

Figure 4:
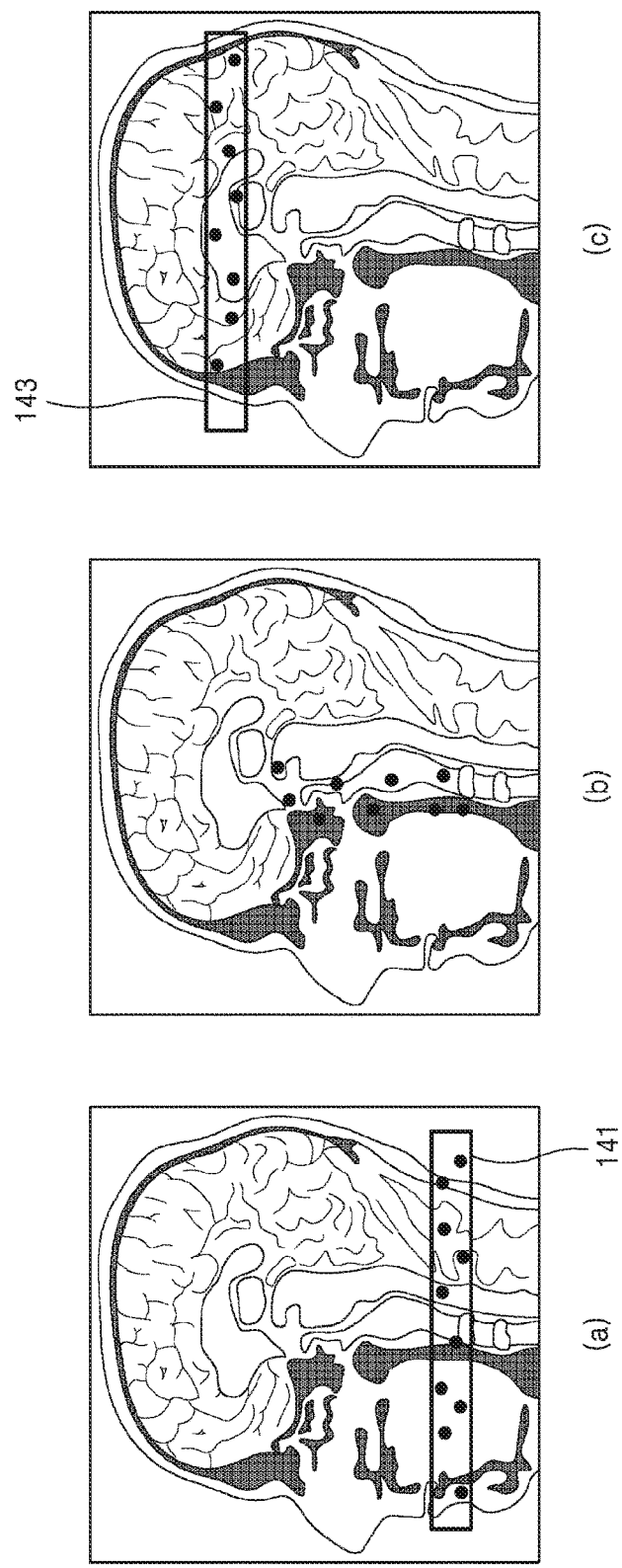
FIG. 4 is a diagram illustrating a method of a magnetic resonance imaging apparatus generating a magnetic resonance signal at an RF labeling period, a post labeling delay (PLD) period and a data acquisition period, according to an exemplary embodiment.

FIG. 4 is a diagram illustrating a method of a magnetic resonance imaging apparatus generating a magnetic resonance signal at an RF labeling period, a PLD period and a data acquisition period, according to an exemplary embodiment.

View (a) of FIG. 4 is a view illustrating the RF labeling period. The signal transceiver may apply the RF signal in such a manner that the blood flow included in a neck part 141 of the object may go into excitation with an 180 degree flip angel at the RF labeling period.

View (b) of FIG. 4 is a view illustrating the PLD period. The signal transceiver may remain waiting so that the blood flow that has gone through the excitation at the PLD period moves to a cerebral part 143 from the neck part 141 of the subject.

View (c) of FIG. 4 is a view illustrating the data acquisition period. The signal transceiver may receive the first magnetic resonance signal from the blood flows which have gone through the excitation when moved to the cerebral part 143 at the data acquisition period. The image processor may generate the label image data through the first magnetic resonance signal.

In one or more exemplary embodiments, the signal transceiver may receive the second magnetic resonance signal from the blood flows which have not gone through the excitation at the neck. The image processor may generate the control image data through the second magnetic resonance signal.

The magnetic resonance imaging apparatus 100 may generate the label image data and the control image data as described in detail above several times.

The image processor may generate the ASL image by comparing the label image data and the control image data which are generated after several procedures.

Figure 5:
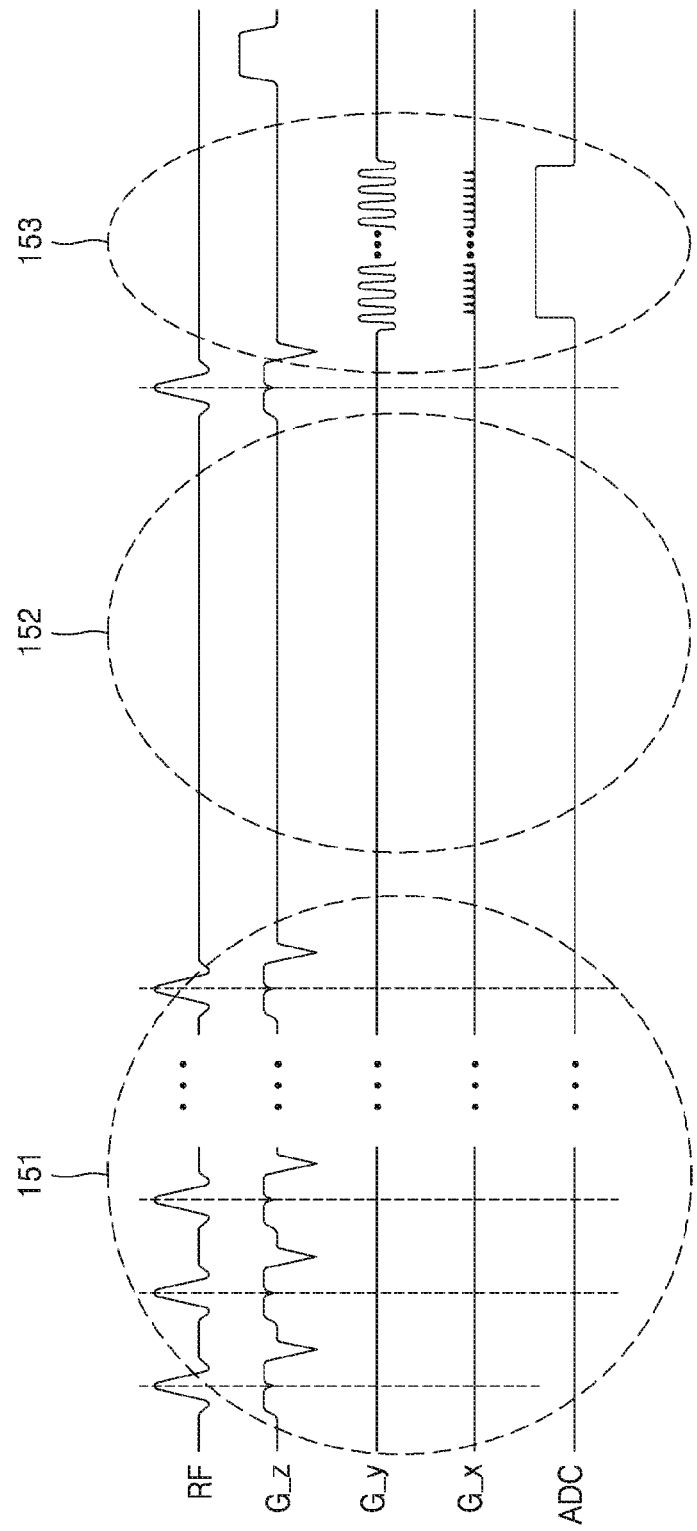
FIG. 5 is a view illustrating an order in which a magnetic resonance imaging apparatus applies a signal to an object, according to an exemplary embodiment.

FIG. 5 is a view illustrating an order in which a magnetic resonance imaging apparatus applies a signal to an object, according to an exemplary embodiment.

Referring to FIG. 5, the magnetic resonance imaging apparatus 100 applies an RF signal RF and a gradient magnetic field G_z, G_y, and G_x at an RF labeling period 151, a PLD period 152 and an data acquisition period 153 to generate label image data, e.g., ADC.

In one or more exemplary embodiments, the magnetic resonance imaging apparatus 100 may apply the RF signal and the gradient magnetic field at the data acquisition period 153 to generate control image data, e.g., ADC, as shown in FIG. 5.

The magnetic resonance imaging apparatus 100 may make the blood flow which runs through the neck of the object go into excitation with a flip angel by applying the RF signal and applying the slice encoding gradient magnetic field (G_z) at the RF labeling period 151.

The magnetic resonance imaging apparatus 100 may remain waiting so that the blood flows which have gone through the excitation at the PLD period 152 are channeled to the cerebral part.

The magnetic resonance imaging apparatus 100 may acquire the magnetic resonance data by applying the RF pulse and the gradient magnetic field in a 3D bSSFP sequence at the data acquisition period 153, as shown in FIG. 5.

FIG. 6 is a view illustrating an order in which a magnetic resonance imaging apparatus applies an RF pulse RF and a gradient magnetic field G_z, G_y, and G_x to an object, in a case that the magnetic resonance imaging apparatus acquires data by using a bSSFP sequence, according to an exemplary embodiment.

Referring to FIG. 6, a first period 153_a and a second period 153_b shows one cycle in which the magnetic resonance imaging apparatus applies the RF pulse RF and the gradient magnetic field G_x, G_y, and G_z. For example, the first period 153_a and the second period 153_b may be included in the data acquisition period 153 of FIG. 5.

In the balanced SSFP sequence, the gradient magnetic field G_x in the readout direction and the slice encoding gradient magnetic field G_z are symmetric with respect to each other. In one or more exemplary embodiments, the phase encoding gradient magnetic field G_y may apply the gradient magnetic field that has an opposite code after applying the gradient magnetic field.

The balanced SSFP sequence may be also called a true fast imaging with steady state procession (FISP), a fast imaging employing steady state acquisition (FIESTA), or a balanced fast field echo (b-FFE), depending on a manufacturer of the magnetic resonance imaging apparatus.

Figure 7:
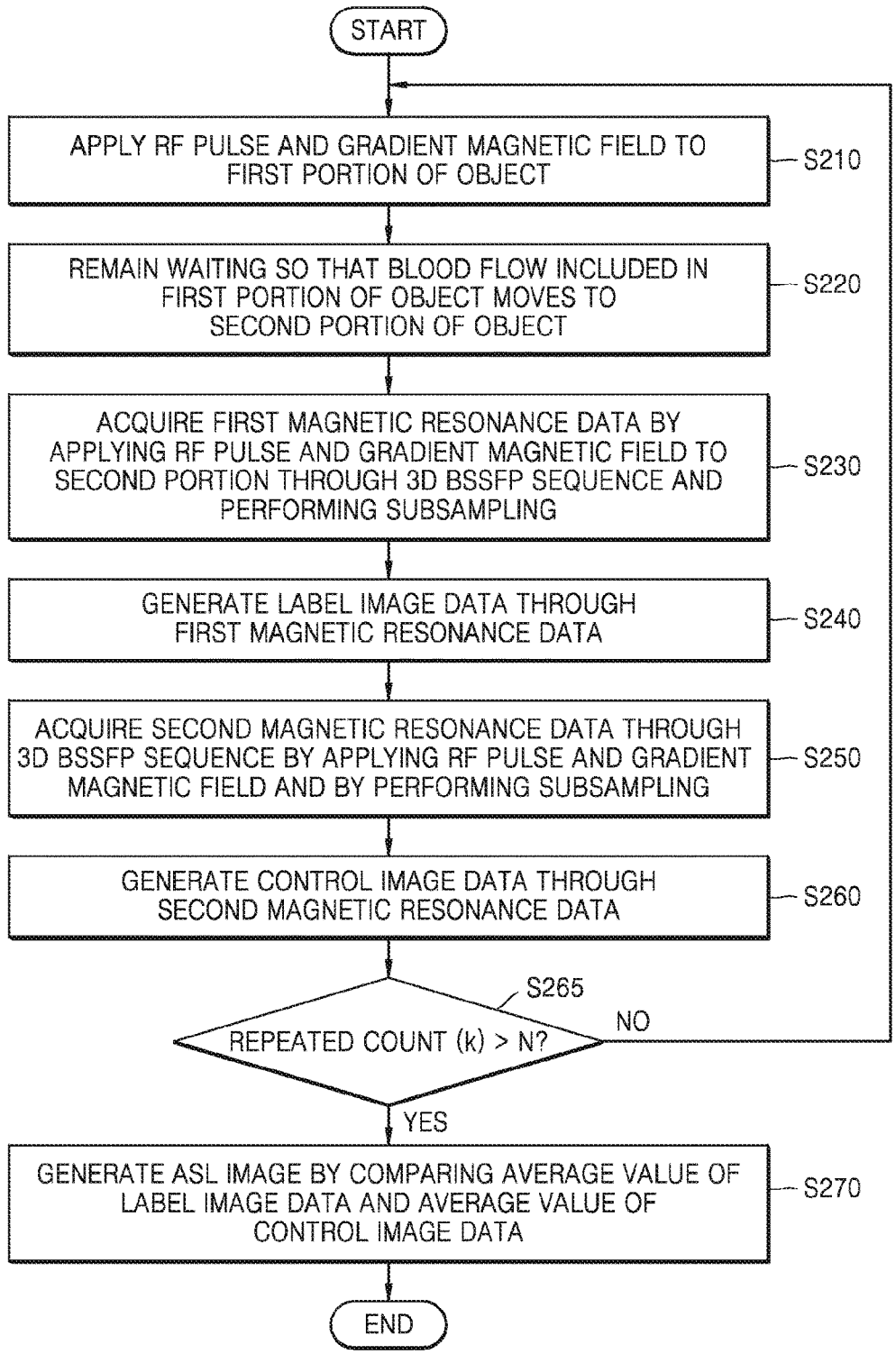
FIG. 7 is a flowchart illustrating a method of generating a magnetic resonance image, according to an exemplary embodiment.

FIG. 7 is a flowchart illustrating a method of generating a magnetic resonance image, according to an exemplary embodiment.

Referring to FIG. 7, the magnetic resonance imaging apparatus 100 may acquire an ASL image through a balanced SSFP sequence during stages 210 through S270. The stages S210, S220, S230, S240, S250, and S260 are similar to the stages S110, S120, S130, S140, S150, S160 and S170, respectively, described in FIG. 3, and a repeated description thereof will be omitted.

At stage S265, the magnetic resonance imaging apparatus 100 determines whether a repeated count (k) of performing operations S210 through S260 is greater than a predetermined number N. If the magnetic resonance imaging apparatus 100 determines that the repeated count (k) is greater than the predetermined number N, the magnetic resonance imaging apparatus 100 continues in stage S270. Otherwise, the magnetic resonance imaging apparatus 100 returns to stage S210. Accordingly, the magnetic resonance imaging apparatus 100 may generate an N-th label image data and an N-th control image data. The magnetic resonance imaging apparatus 100 may generate an N-number of the label image data and an N-number of the control image data by repeating the stages 210 through S260 N-times.

At stage S270, the magnetic resonance imaging apparatus 100 calculates an average value of the label image data and also calculates an average value of the control image data. The magnetic resonance imaging apparatus 100 further generates the ASL image by comparing the average value of the label image data and the average value of the control image data.

Figure 8:
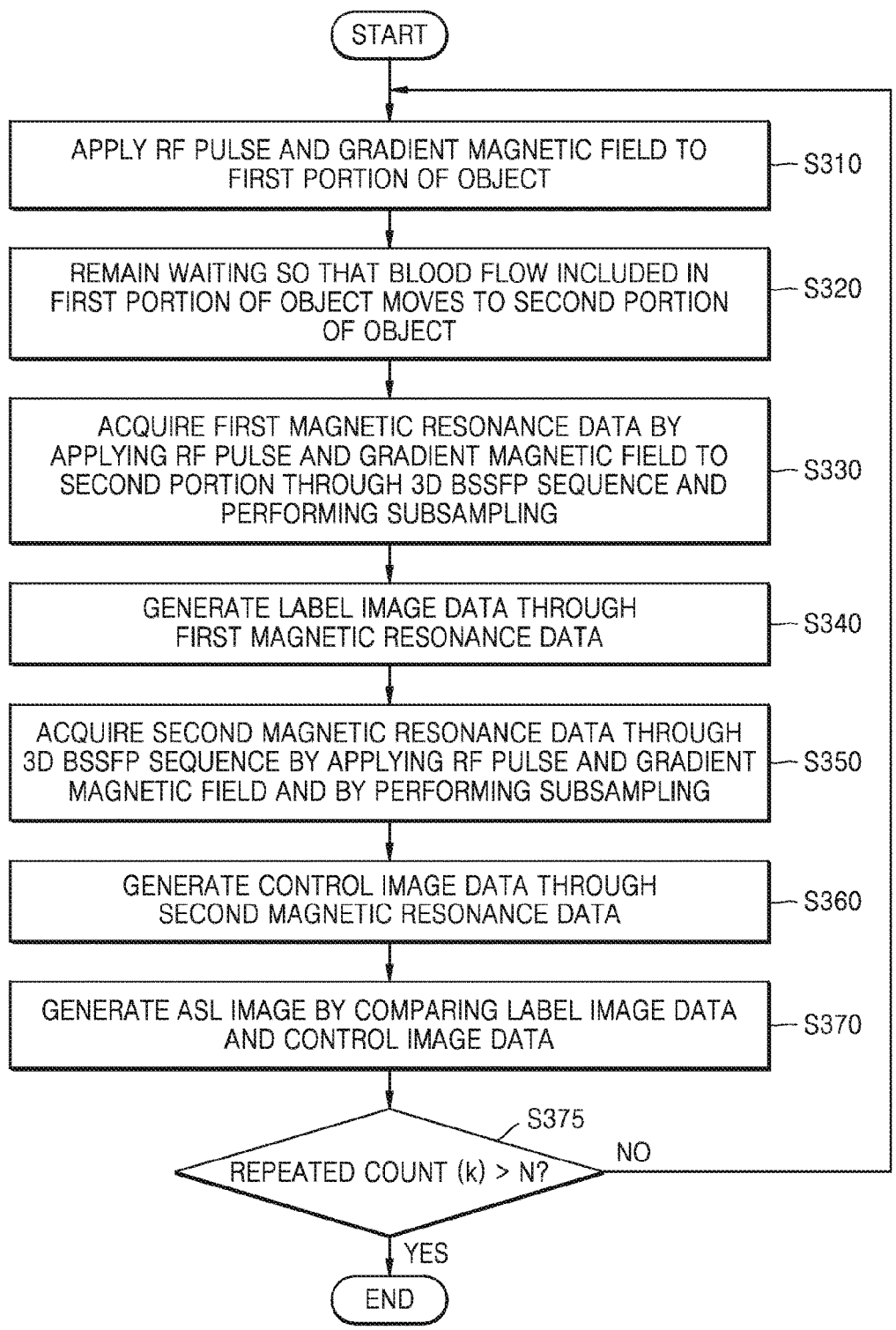
FIG. 8 is a flowchart illustrating a method of generating a magnetic resonance image, according to an exemplary embodiment.

FIG. 8 is a flowchart illustrating a method of generating a magnetic resonance image, according to an exemplary embodiment.

Referring to FIG. 8, the magnetic resonance imaging apparatus 100 acquires an ASL image through a balanced SSFP sequence during stages S310 through S375. The stages S310, S320, S330, S340, S350, and S360 are similar to the stages S110, S120, S130, S140, S150 and S160 described in FIG. 3, and a repeated description thereof will be omitted.

At stage S370, the magnetic resonance imaging apparatus 100 generates the ASL image by comparing the label image data and the control image data.

At stage S375, the magnetic resonance imaging apparatus 100 determines whether a repeated count (k) of performing operations S310 through S370 is greater than a predetermined number N. If the magnetic resonance imaging apparatus 100 determines that the repeated count (k) is greater than the predetermined number N, the magnetic resonance imaging apparatus 100 ends the method. Otherwise, the magnetic resonance imaging apparatus 100 returns to stage S310. Accordingly, the magnetic resonance imaging apparatus 100 may calculate an average value of the ASL image by repeating the stages S310 through S370.

Figure 9:
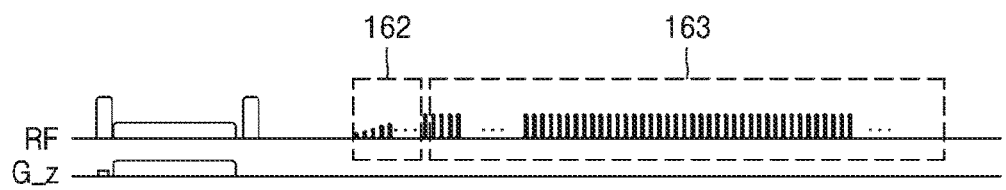
FIG. 9 is a view illustrating a bSSFP sequence at a data acquisition period in a case that a magnetic resonance imaging apparatus generates an arterial spin labeling image by using the bSSFP sequence, according to an exemplary embodiment.

FIG. 9 is a view illustrating a bSSFP sequence at a data acquisition period (153 in FIG. 5) in a case that a magnetic resonance imaging apparatus generates an ASL image by using the bSSFP sequence, according to an exemplary embodiment.

Referring to FIG. 9, the data acquisition period is divided into a transient period 162 and a steady-state period 163. For example, the pulse sequence at the transient period 162 and the pulse sequence at the steady-state period 163 may include the bSSFP sequence at the first period 153_a and the second period 153_b as shown in FIG. 6.

The strength of the RF signal is relatively small at the transient period 162, while the strength of the RF signal is relatively large at the steady-state period 163.

The strength of the ASL image is relatively large at the transient period 162, while the strength of the ASL image is relatively small at the steady-state period 163.

According to an exemplary embodiment, the signal transceiver 110 of the magnetic resonance imaging apparatus 100 may receive the magnetic resonance data that have gone through the subsampling process at the transient period and the steady-state period.

According to an exemplary embodiment, the magnetic resonance imaging apparatus 100 may include the ASL image over the transient period as well as the ASL image over the steady-state period.

In addition, the exemplary embodiments may also be implemented through computer-readable code and/or instructions on a medium, e.g., a computer-readable medium, to control at least one processing element to implement any above-described embodiments. The medium may correspond to any medium or media which may serve as a storage and/or perform transmission of the computer-readable code.

The computer-readable code may be recorded and/or transferred on a medium in a variety of ways, and examples of the medium include recording media, such as magnetic storage media (e.g., ROM, floppy disks, hard disks, etc.) and optical recording media (e.g., compact disc read only memories (CD-ROMs) or digital versatile discs (DVDs)), and transmission media such as Internet transmission media. Thus, the medium may have a structure suitable for storing or carrying a signal or information, such as a device carrying a bitstream according to one or more exemplary embodiments. The medium may also be on a distributed network, so that the computer-readable code is stored and/or transferred on the medium and executed in a distributed fashion. Furthermore, the processing element may include a processor or a computer processor, and the processing element may be distributed and/or included in a single device.

The foregoing exemplary embodiments are examples and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A magnetic resonance imaging apparatus configured to generate an arterial spin labeling (ASL) image, using a 3D balanced steady-state free precession (bSSFP) sequence, the apparatus comprising:
 a signal transceiver;
 a sequence controller configured to control the signal transceiver to:
  apply an RF pulse and a gradient magnetic field to a first portion of an object;
  wait for blood to flow from the first portion of the object to which the RF pulse and the gradient magnetic field are applied, to a second portion of the object;
  apply the RF pulse and the gradient magnetic field to the second portion of the object to which the blood flows, using the 3D bSSFP, in response to the blood flowing from the first portion to the second portion; and
  subsample first magnetic resonance data from the second portion of the object to which the RF pulse and the gradient magnetic field are applied, during a transient period and a steady-state period of the RF pulse; and
 an image processor configured to generate label image data based on the first magnetic resonance data.

2. The apparatus of claim 1, wherein the image processor is further configured to generate the label image data using parallel imaging.

3. The apparatus of claim 1, wherein the sequence controller is further configured to control the signal transceiver to acquire the first magnetic resonance data from an entire area of the object that is imaged during a data acquisition period.

4. The apparatus of claim 1, wherein the image processor is further configured to generate the ASL image based on the label image data.

5. The apparatus of claim 1, wherein the sequence controller is further configured to control the signal transceiver to:
 apply the RF pulse and the gradient magnetic field to the first portion of the object during an RF labeling period;
 apply the RF pulse and the gradient magnetic field to the second portion of the object during a data acquisition period; and
 receive a magnetic resonance signal from the second portion of the object to which the RF pulse and the gradient magnetic field are applied, and
 the image processor is further configured to generate the label image data based on the magnetic resonance signal.

6. The apparatus of claim 5, wherein a time between the RF labeling period and the data acquisition period is long enough to allow the blood to flow from the first portion of the object to the second portion of the object.

7. The apparatus of claim 1, wherein the sequence controller is further configured to control the signal transceiver to:
 apply the RF pulse and the gradient magnetic field to the second portion of the object during a data acquisition period without applying the RF pulse and the gradient magnetic field to the first portion of the object during an RF labeling period; and
 receive a magnetic resonance signal from the second portion of the object to which the RF pulse and the gradient magnetic field are applied, and
 the image processor is further configured to generate control image data based on the magnetic resonance signal.

8. The apparatus of claim 1, wherein the sequence controller is further configured to control the signal transceiver to:
 apply the RF pulse and the gradient magnetic field to the second portion of the object, using the 3D bSSFP without applying the RF pulse and the gradient magnetic field to the first portion of the object; and
 subsample second magnetic resonance data from the second portion of a subject to which the RF pulse and the gradient magnetic field are applied, and
 the image processor is further configured to generate control image data based on the second magnetic resonance data.

9. The apparatus of claim 8, wherein the image processor is further configured to generate the ASL image based on the control image data and the label image data.

10. A medical imaging system comprising:
 the magnetic resonance imaging apparatus of claim 1; and
 an image processing apparatus configured to process the ASL image.

11. A method of generating an arterial spin labeling (ASL) image, using a 3D balanced steady-state free precession (bSSFP) sequence, the method comprising:
 applying an RF pulse and a gradient magnetic field to a first portion of an object;
 waiting for blood to flow from the first portion of the object to which the RF pulse and the gradient magnetic field are applied, to a second portion of the object;
 applying the RF pulse and the gradient magnetic field to the second portion of the object to which the blood flows, using the 3D bSSFP, in response to the blood flowing from the first portion to the second portion;
 subsampling first magnetic resonance data from the second portion of a subject to which the RF pulse and the gradient magnetic field are applied, during a transient period and a steady-state period of the RF pulse; and
 generating label image data based on the first magnetic resonance data.

12. The method of claim 11, wherein the generating comprises generating the label image data using parallel imaging.

13. The method of claim 11, wherein the subsampling comprises acquiring the first magnetic resonance data from an entire area of the object that is imaged during a data acquisition period.

14. The method of claim 11, further comprising:
 applying the RF pulse and the gradient magnetic field to the second portion of the object, using the 3D bSSFP without applying the RF pulse and the gradient magnetic field to the first portion of the object;
 subsampling second magnetic resonance data from the second portion of the subject to which the RF pulse and the gradient magnetic field are applied; and
 generating control image data based on the second magnetic resonance data.

15. The method of claim 14, wherein the subsampling the second magnetic resonance data comprises subsampling the second magnetic resonance data during the transient period and the steady-state period of the RF pulse.

16. The method of claim 14, wherein the generating the control image data comprises generating the control image data using parallel imaging.

17. The method of claim 14, wherein the subsampling the second magnetic resonance data comprises acquiring the second magnetic resonance data from an entire area of the object that is imaged during a data acquisition period.

18. The method of claim 14, further comprising generating the ASL image based on the control image data and the label image data.

19. A non-transitory computer-readable storage medium storing a program comprising instructions to cause a computer to perform the method of claim 11.

* * * * *